(12) United States Patent
Chu et al.

(10) Patent No.: US 6,242,365 B1
(45) Date of Patent: Jun. 5, 2001

(54) METHOD FOR PREVENTING FILM DEPOSITED ON SEMICONDUCTOR WAFER FROM CRACKING

(75) Inventors: Jason C. S. Chu, Yunghe; Jerry C. S. Lin, Tainan; Roger Tun-Fu Hung, Fengshan; Chih-Ta Wu, Hsinchu, all of (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/325,915

(22) Filed: Jun. 4, 1999

(30) Foreign Application Priority Data

Feb. 22, 1999 (TW) .................................................. 88102577

(51) Int. Cl.$^7$ .................................................. H01L 21/322

(52) U.S. Cl. ........................... 438/782; 438/473; 438/680; 438/758

(58) Field of Search ..................................... 438/473, 680, 438/758, 782

(56) References Cited

U.S. PATENT DOCUMENTS 5,989,983 * 12/1999 Goo et al. ............................. 438/473

* cited by examiner

*Primary Examiner*—Charles Bowers
*Assistant Examiner*—Lisa Kilday
(74) *Attorney, Agent, or Firm*—Edwards & Angell LLP; David G. Conlin; Peter F. Corless

(57) ABSTRACT

A method for preventing a target film deposited on a wafer in production from cracking after a post annealing procedure is disclosed. The method is performed by previously determining a crack limit before the target film is deposited on the wafer in production. The crack limit is determined by adopting and adjusting the thermal shrinkage rates of a plurality of target films deposited on bare wafers and annealed. After the crack limit is determined, a system-adjusting step and a reconfirmation step are performed, if necessary, to make sure the system conditions determined by the test results on bare wafers are suitably applied to the production wafers to prevent from film cracking. Moreover, the instrumental conditions can be inspected and tuned accordingly.

19 Claims, No Drawings

METHOD FOR PREVENTING FILM DEPOSITED ON SEMICONDUCTOR WAFER FROM CRACKING

FIELD OF THE INVENTION

The present invention is related to a method for preventing a target film deposited on a wafer in production from cracking, and more particularly to a method for preventing an undoped silicon glass (USG) film deposited on a wafer in production by a chemical vapor deposition process from cracking after a post annealing procedure.

BACKGROUND OF THE INVENTION

An undoped silicon glass (USG) film deposited by a chemical vapor deposition (CVD) process has been widely used in the field of IC fabrication as a shallow trench isolation (STI) gap fill, sidewall spacer, inter-metal dielectric (IMD) or passivation dielectric. For the CVD process, $O_3$/TEOS is preferred over $SiH_4$ due to better gap fill or step coverage capability as well as safety consideration. On the other hand, a sub atmosphere (SA) CVD process is prior to an atmosphere (AP) CVD process and a plasma enhanced (PE) CVD process to serve as the deposition technique for depositing the USG film because of the better balance in the deposition rate and the gap fill capability. Therefore, so far, an SA $O_3$/TEOS process is commonly used for the deposition of a USG film.

The SA $O_3$/TEOS process, however, still suffers from a drawback that the as-deposited film is porous and inclined to absorb moisture. Therefore, a post annealing procedure will be necessary to densify the film. In the meantime, the within film tensile stress is subject to elevation during the thermal annealing procedure so as to cause the film crack. Therefore, the situation of the USG film during the IC production is generally checked to detect or even prevent the crack of the film, and it is preferred to adopt a non-destructive method.

Several parameters of the within film such as the deposition rate and the HF etching rate have been monitored to determine the crack limit of the film in order to prevent from cracking, but none of them is sensitive enough to serve as an indicator to achieve this purpose. In addition, a painstaking scanning electron microscope (SEM) process can be used to check the situation of the USG film via an off line operation, and the SEM results generally tell the crack situation of the film rather than prevent it.

SUMMARY OF THE INVENTION

Therefore, an object of the present invention is to provide a method for determining a crack limit of a target film deposited on a wafer in production without any destruction.

Another object of the present invention is to prevent a target film deposited on a wafer in production from cracking after a post annealing procedure by previously determining a crack limit.

According to the present invention, a method for preventing a target film deposited on a wafer in production from cracking after a post annealing procedure includes steps of:

a) forming a plurality of target films on respective bare wafers;

b) annealing the bare wafers with the target films;

c) observing whether the target films on the bare wafers crack;

d) detecting thermal shrinkage rates of the target films on the bare wafers to determine a crack limit when there is film cracking observed in the step c);

e) adjusting deposition conditions and repeating the steps a) and b), and then detecting thermal shrinkage rates of the target films newly formed on bare wafers;

f) repeating the step e) until no target films on bare wafers having thermal shrinkage rates exceeding the crack limit; and g) allowing the target film to be deposited on the wafer in production under the adjusted deposition conditions.

Preferably, the plurality of target films are formed on the respective bare wafers with at least two kinds of thickness in order to make the test results on the bare wafers as complete as possible. More preferably, at least one of the at least two kinds of thickness approximates to the thickness of the target film to be deposited on the wafer in production. For obtaining comparable results, the conditions for forming and annealing the target films on the bare wafers are preferably identical to those for forming and annealing the target film on the wafer in production.

If there is film cracking on the bare wafers observed in the step c), then each of the thermal shrinkage rates (SR) of the target films which do no crack is defined by an equation of $SR=(T1-T2)/T1$, in which T1 indicates the thickness of a target film detected before the annealing procedure, and T2 indicates the thickness of a target film detected after the annealing procedure.

After the thermal shrinkage rates are determined, the crack limit can be determined for example by selecting the highest one of the thermal shrinkage rates of the annealed target films which do not crack as a threshold value, and subtracting a buffer value from the threshold value to have the crack limit. The presence of the buffer value is for further assuring of the perfection of the target film on the wafer in production when the test results on bare wafers are applied to the production wafers. As for the selection of the buffer value, it can be made by a trial and error method, or as large as possible provided that other desired properties are not influenced significantly.

In the step e), the deposition conditions to be adjusted include a flowing rate of a chemical precursor. Alternatively, the deposition conditions to be adjusted include a mechanical state of a deposition system for forming the target film on the wafer in production provided that the deposition system for forming the target film on the wafer in production is the same as that for forming the target films on the bare wafers.

The method according to the present invention, on the other hand, further includes a step after the step c) of directly depositing the USG film on the wafer in production under the same deposition conditions as the step a) if there is no film cracking observed in the step c).

The present method for example can be applied to a USG film formed by a SACVD process on a wafer with a MOS layer and a contact.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

First of all, nine bare wafers are provided and deposited thereon USG films of three kinds of thickness in an SACVD system. The chemical precursor used in the SACVD system is $O_3$/TEOS. The three kinds of thickness are 4.5 kÅ, 6 kÅ and 7 kÅ, each for three samples. After the USG films are formed on the bare wafers, they are subjected to a post annealing procedure at about 800° C.

After the annealing procedure, the situations of the nine samples are observed to see whether the respective USG films crack or not. If there is no film cracking observed, the deposition conditions used for forming the USG films on bare wafers as above can be directly used to form USG films on production wafers without worrying about film cracking in the production process. On the contrary, if there is film cracking observed, the thickness of the samples which do not crack is measured and compared with the thickness thereof before annealing to calculate their respective thermal shrinkage rates. The thermal shrinkage rate (SR) is defined by an equation of:

$$SR=(T1-T2)/T1$$

in which T1 indicates the thickness of a target film detected before the annealing procedure, and T2 indicates the thickness of a target film detected after the annealing procedure. For example, for one of the samples having the thickness of 4.5 kÅ before annealing, the thickness thereof after annealing is measured as about 4.07 kÅ, so the thermal shrinkage rate SR will be equal to $(4.5-4.07)/4.5 \approx 9.56\%$.

In this embodiment, the three kinds of thickness are used for making the test results on the bare wafers as complete as possible. Furthermore, when choosing the thickness of the USG films to be deposited on the bare wafers, it is preferred to have at least one kind of the thickness approximate to the real USG films to be deposited on the production wafers. By this way, the test results on bare wafers will be more suitable for the production wafers. In addition, for obtaining comparable results, the conditions for forming and annealing the target films on the bare wafers are preferably identical to those for forming and annealing the target film on the wafer in production.

From the thermal shrinkage rate data, the highest one of the thermal shrinkage rates of the annealed target films which do not crack is selected as a threshold value. Then, a crack limit is determined by subtracting a buffer value from the threshold value. For example, for the above USG films deposited on bare wafers in the SACVD system with an ozone flow rate of about 4000 sccm, and annealed at a temperature of about 800° C., the threshold value summarized from the thermal shrinkage rates of the nine samples is about 9.7%. Because the crack limit indicated by thermal shrinkage rate for being applied to USG films deposited on production wafers is determined according to the thermal shrinkage rates of the USG films deposited on bare wafers, the threshold value had better be slightly adjusted to obtain the crack limit in order to make sure that the test results on bare wafers can be perfectly applied to the production wafers. Therefore, a buffer value is preferably present to modify the threshold value to obtain the crack limit which is to be applied to the real manufacturing process. As for the selection of the buffer value, it can be made by a trial and error method, or as large as possible provided that other desired properties are not influenced significantly. In this embodiment, a buffer value is chosen as 2%. In other words, the crack limit for the USG film deposited on the wafer in production after a post annealing procedure is determined as about 9.5% by thermal shrinkage rate.

After the crack limit is determined, an adjusting step is performed. Because film cracking occurs under the current deposition conditions, the deposition conditions should be adjusted to avoid film cracking. In other words, the parameters used in the manufacturing process and/or the instrumental conditions should be modified and tuned. For example, the ozone flow rate of the chemical precursor $O_3$/TEOS is changed from 4000 sccm to about 5500 sccm.

After the deposition conditions are adjusted, a reconfirmation step is performed. Another group of bare wafers are provided and deposited thereon USG films in the SACVD system under the new deposition conditions. Likely, the resulting wafers are annealed at about 800° C. It should be noted that the number of samples used in this reconfirmation step is not necessarily equal to that for determining the crack limit in spite the more the samples, the more reliable the test results.

After the annealing process, the thermal shrinkage rates of the newly formed USG films are measured. If there is no sample having a thermal shrinkage rate exceeding the crack limit, the adjusted deposition conditions are allowed to be applied to the formation step of the USG films on the production wafers. Otherwise, the deposition conditions should be further adjusted, and the reconfirmation step should be performed again until no USG films on bare wafers having thermal shrinkage rates exceeding the crack limit. By this way, the film cracking on the production wafers can be avoided. Moreover, the instrumental conditions can be inspected and tuned accordingly.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for preventing a target film deposited on a wafer in production from cracking after a post annealing procedure, comprising steps of:
   a) forming a plurality of target films on respective bare wafers;
   b) annealing said bare wafers with said target films;
   c) observing whether said target films on said bare wafers crack;
   d) detecting thermal shrinkage rates of said target films on said bare wafers to determine a crack limit when there is film cracking observed in said step c);
   e) adjusting deposition conditions, repeating said steps a) and b), and then detecting thermal shrinkage rates of said target films newly formed on bare wafers;
   f) repeating said step e) until no target films on bare wafers having thermal shrinkage rates exceeding said crack limit; and
   g) allowing said target film to be deposited on said wafer in production under said adjusted deposition conditions.

2. The method according to claim 1 wherein said plurality of target films are formed on said respective bare wafers with at least two kinds of thickness.

3. The method according to claim 1 wherein conditions for forming said target films on said bare wafers are identical to those for forming said target film on said wafer in production.

4. The method according to claim 3 wherein conditions for annealing said target films on said bare wafers are identical to those for annealing said target film on said wafer in production.

5. The method according to claim 1 wherein each of said thermal shrinkage rates (SR) of said annealed target films is calculated by an equation of:

$$SR=(T1-T2)/T1$$

in which T1 indicates the thickness of a target film detected before said annealing procedure, and T2 indicates the thickness of a target film detected after said annealing procedure.

6. The method according to claim 1 wherein said crack limit is determined by selecting the highest one of said thermal shrinkage rates of said annealed target films which do not crack as a threshold value, and subtracting a buffer value from said threshold value to have said crack limit.

7. The method according to claim 1 wherein said target film is an undoped silicon glass (USG) film.

8. The method according to claim 7 wherein said plurality of USG films are formed on said respective bare wafers with at least two kinds of thickness.

9. The method according to claim 8 wherein at least one of said at least two kinds of thickness approximates to a thickness of said USG film to be deposited on said wafer in production.

10. The method according to claim 8 wherein conditions for forming said USG films on said bare wafers are identical to those for forming said USG film on said wafer in production.

11. The method according to claim 10 wherein said conditions include the use of $O_3$/TEOS as a chemical precursor for deposition, and the use of sub-atmosphere chemical vapor deposition (SACVD) as a deposition technique.

12. The method according to claim 11 wherein conditions for annealing said USG films on said bare wafers are identical to those for annealing said USG film on said wafer in production.

13. The method according to claim 12 wherein said conditions include an annealing temperature of about 800° C.

14. The method according to claim 13 wherein said crack limit for said USG film is a thermal shrinkage rate of about 9.5%.

15. The method according to claim 14 wherein said deposition conditions to be adjusted in said step e) include an ozone flow rate of said chemical precursor $O_3$/TEOS.

16. The method according to claim 14 wherein a deposition system for forming said target films on said bare wafers is the same as that for forming said target film on said wafer in production.

17. The method according to claim 16 wherein said deposition conditions to be adjusted in said step e) include a mechanical state of said deposition system.

18. The method according to claim 7 further comprising a step after said step c) of directly depositing said USG film on said wafer in production under the same deposition conditions as said step a) when there is no film cracking observed in said step c).

19. The method according to claim 7 wherein in said step f), said USG film is formed on said wafer in production having previously formed thereon a MOS layer and a contact.

* * * * *